United States Patent [19]

Park

[11] Patent Number: 5,394,027
[45] Date of Patent: Feb. 28, 1995

[54] HIGH VOLTAGE CHARGE PUMP AND RELATED CIRCUITRY

[75] Inventor: David K. Park, Chandler, Ariz.
[73] Assignee: Motorola, Inc., Schaumburg, Ill.
[21] Appl. No.: 144,361
[22] Filed: Nov. 1, 1993
[51] Int. Cl.⁶ .............................................. G05F 3/16
[52] U.S. Cl. ............................... 327/536; 365/189.09; 365/226; 327/530; 327/306
[58] Field of Search ................... 307/264, 296.2, 296.6, 307/296.8, 296.1, 578; 365/189.09, 226

[56] References Cited

U.S. PATENT DOCUMENTS

| | | | |
|---|---|---|---|
| 4,326,134 | 5/1982 | Owen et al. | 307/268 |
| 4,486,670 | 12/1984 | Chan et al. | 307/264 |
| 4,710,647 | 12/1987 | Young | 307/296.2 |
| 4,792,705 | 12/1988 | Ouyang et al. | 307/296 |
| 5,081,371 | 1/1992 | Wong | 307/296.2 |
| 5,111,375 | 5/1992 | Marshall | 363/60 |
| 5,126,590 | 6/1992 | Chern | 307/296.2 |
| 5,134,317 | 7/1992 | Ohta | 307/482 |
| 5,138,190 | 8/1992 | Yamazaki et al. | 307/296.5 |
| 5,153,855 | 10/1992 | Konishi | 365/229 |
| 5,168,174 | 12/1992 | Naso et al. | 307/296.6 |

OTHER PUBLICATIONS

Duane Oto et al., "High-Voltage Regulation and Process Considerations for High-Density 5V-Only E2-PROM's", IEEE Journal of Solid-State Circuits, vol. SC-18, No. 5, Oct. 1983, pp. 532-538.

Primary Examiner—Timothy P. Callahan
Assistant Examiner—Jung H. Kim
Attorney, Agent, or Firm—Susan C. Hill

[57] ABSTRACT

Charge pump and related circuitry (30) for operation at low power supply voltages includes voltage elevating circuitry (51), clock voltage level shifting circuitry (53), clock separator (55) and charge pump (57). The voltage elevating circuitry (51) receives a power supply voltage VDD and provides an elevated intermediate output voltage V1. The clock voltage level shifting circuitry (53) receives an input clock signal and the voltage V1. The clock voltage level shifting circuitry (53) shifts the maximum voltage level of the CLOCK1 signal from VDD to V1 and provides this signal, labeled SHIFTED CLOCK, as an output. Clock separator (55) receives the SHIFTED CLOCK signal and provides non-overlapping, elevated clocks CLOCKA, CLOCKB, CLOCKC, and CLOCKD, each having a maximum voltage level of V1. Charge pump 57 utilizes the elevated clock signals to provide a high voltage output VOUT.

20 Claims, 5 Drawing Sheets

HIGH VOLTAGE CHARGE PUMP AND RELATED CIRCUITRY

FIELD OF THE INVENTION

The present invention relates in general to charge pump circuitry, and more particularly to high voltage charge pump and related circuitry for operation at low power supply voltages.

BACKGROUND OF THE INVENTION

An Electrically Erasable Programmable Read Only Memory (EEPROM) is a type of nonvolatile memory that is reprogrammable. EEPROM cells are arranged as an array and located at the intersections of rows and columns. An EEPROM cell generally comprises a floating gate transistor and a select transistor. Programming and erasing of the EEPROM cell is accomplished by applying a high voltage to the control electrode of the floating gate transistor. During programming, the select transistor is used to isolate the unselected EEPROM cells that are located on the same column. A programming voltage as high as 18-20 volts may be needed to perform a program or erase operation.

A detailed description of a prior art charge pump is described in the specification and in FIGS. 1 and 2 of a related, copending application entitled "High Voltage Charge Pump", invented by Bruce Lee Morton, having Ser. No. 08/028,000, filed Mar. 8, 1993, and assigned to the assignee hereof, which is expressly incorporated by this reference. Some prior art charge pumps became less efficient for power supply voltages less than about 3.75 volts, and in fact do not function adequately for low power supply voltages, such as 3.3 volts.

In fact, most prior art charge pumps either do not function properly or cannot generate a sufficiently high voltage output (18 volts or more) below a power supply voltage of approximately 2.0 volts. There are two main problems with typical prior art charge pumps which use a series of stages to build up the voltage output. First, as the power supply voltage drops, charge transfer between the stages becomes less efficient. This reduction in efficiency is due to the fact that the clock inputs to circuits which control the charge transfer are weakened as the power supply voltage drops. Second, amount of charge which can be stored on capacitors in the stages is decreased as the power supply voltage drops. Therefore, these drawbacks of prior art charge pumps cause the final voltage output of the prior art charge pump to be reduced. If the final voltage output of the prior art charge pump is reduced too much, the prior art charge pump may not be able to successfully program or erase the EEPROM cells.

SUMMARY OF THE INVENTION

The previously mentioned needs are fulfilled and other advantages achieved with the present invention. In one form, the present invention is a circuit for generating an output voltage.

The circuit for generating an output voltage has a voltage elevating means (51) for receiving an input voltage having a first predetermined voltage level and for providing an intermediate voltage having a second predetermined voltage level. The second predetermined voltage level is higher potential than the first predetermined voltage level.

The circuit for generating an output voltage also has a clock voltage level shifting means (53) for receiving a first input clock signal, for receiving the intermediate voltage, and for providing a shifted clock signal. The first input clock signal has a maximum voltage level substantially equal to the first predetermined voltage level. The shifted clock signal has a maximum voltage level substantially equal to the second predetermined voltage level. The clock voltage level shifting means is coupled to the voltage elevating means.

The circuit for generating an output voltage also has a clock separating means (55) for receiving the shifted clock signal, for receiving the intermediate voltage, and for providing at least one output clock signal. The clock separating means is coupled to the voltage elevating means and to the clock voltage level shifting means.

The circuit for generating an output voltage also has charge pump circuitry (57) for receiving the at least one output clock signal and for providing the output voltage. The output voltage has a third predetermined voltage level. The third predetermined voltage level is higher potential than the second predetermined voltage level. The charge pump circuitry is coupled to the clock separating means.

DESCRIPTION OF THE PREFERRED EMBODIMENT

The present invention provides charge pump and related circuitry 30 which can be used to provide a high voltage output (18 volts or more) using a low power supply voltage (below 2 volts). Most prior art charge pumps either do not function properly or cannot generate a sufficiently high output voltage (18 volts or more) below a power supply voltage of approximately 2.0 volts. The present invention utilizes circuitry which extends the operating voltage range for which a charge pump can generate a sufficiently high output voltage. That is, the present invention allows charge pump and related circuitry 30 to operate at power supply voltages below that of prior art charge pumps.

The present invention extends the operating voltage range of charge pumps by utilizing voltage elevating circuitry 51 and clock voltage level shifting circuitry 53: (1) to produce stronger clock drives to circuits (e.g. charge pump 57) which control the charge transfer between the stages; and (2) to increase the amount of charge that can be stored on the capacitors in the stages (e.g. in the stages of charge pump 57). Thus, under circumstances where a typical prior art charge pump would fail, the present invention can continue to produce an output voltage of 18 volts or more using a power supply voltage as low as 1.8 volts (and possibly even lower).

The present invention is especially useful in applications that require a high output voltage to be generated using a power supply voltage level as low as 1.8 volts, and possibly lower. For example, the invention may be especially useful in very low voltage and/or very low power applications such as battery operated applications (e.g. applications involving portable devices such as pagers, lap top computers, global positioning systems, cellular phones, or personal communicators). In addition, the present invention is especially useful in applications which use one or more batteries in which the device must continue to function even when the battery is supplying as little as 1.8 volts.

The present invention can be more fully understood with reference to FIGS. 1-6.

Figure 1:
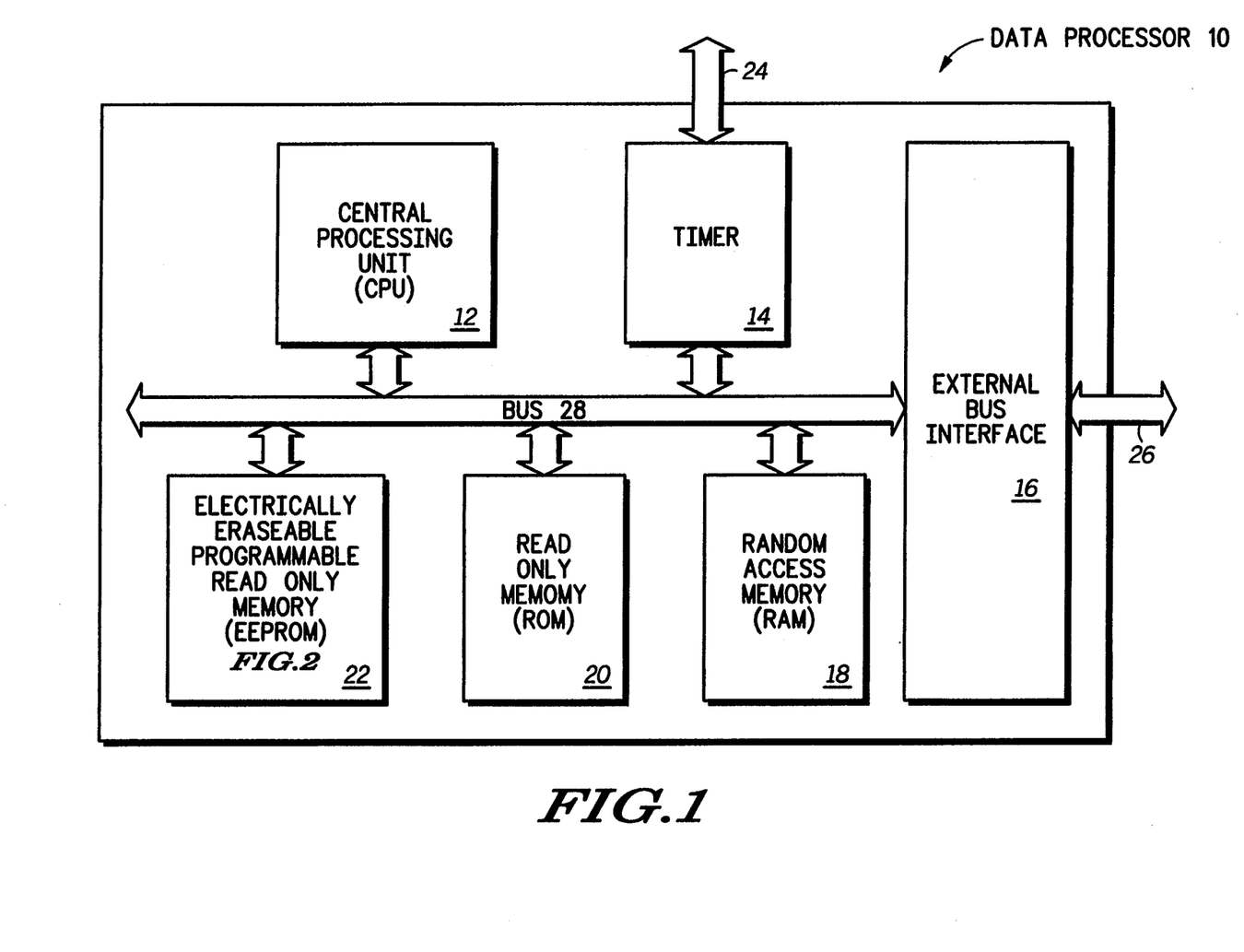
FIG. 1 illustrates, in block diagram form, a data processor 10 in accordance with one embodiment of the present invention.

FIG. 1 illustrates one embodiment of a data processor 10 that includes a central processing unit (CPU) 12, a timer 14, external bus interface 16, random access memory (RAM) 18, read only memory (ROM) 20, and electrically erasable programmable read only memory (EEPROM) 22, which are all bi-directionally coupled to bus 28. Timer 14 is coupled external to data processor 10 by way of integrated circuit pins 24. External bus interface 16 is coupled external to data processor 10 by way of integrated circuit pins 26. In one embodiment of the present invention, an external data bus (not shown) and an external address bus (not shown) are coupled to integrated circuit pins 26.

In one embodiment of the present invention, EEPROM 22 may be read and programmed by CPU 12. In the illustrated embodiment of the present invention, CPU 12 uses bus 28 to perform read and/or programming accesses to EEPROM 22. In one embodiment, data processor 10 is a microcontroller formed on a single integrated circuit. In an alternate embodiment of the present invention, EEPROM 22 may be formed by itself on a single integrated circuit. In this alternate embodiment, EEPROM 22 may be coupled directly to integrated circuit pins 26 in order to receive and provide signals external to EEPROM 22.

Figure 2:
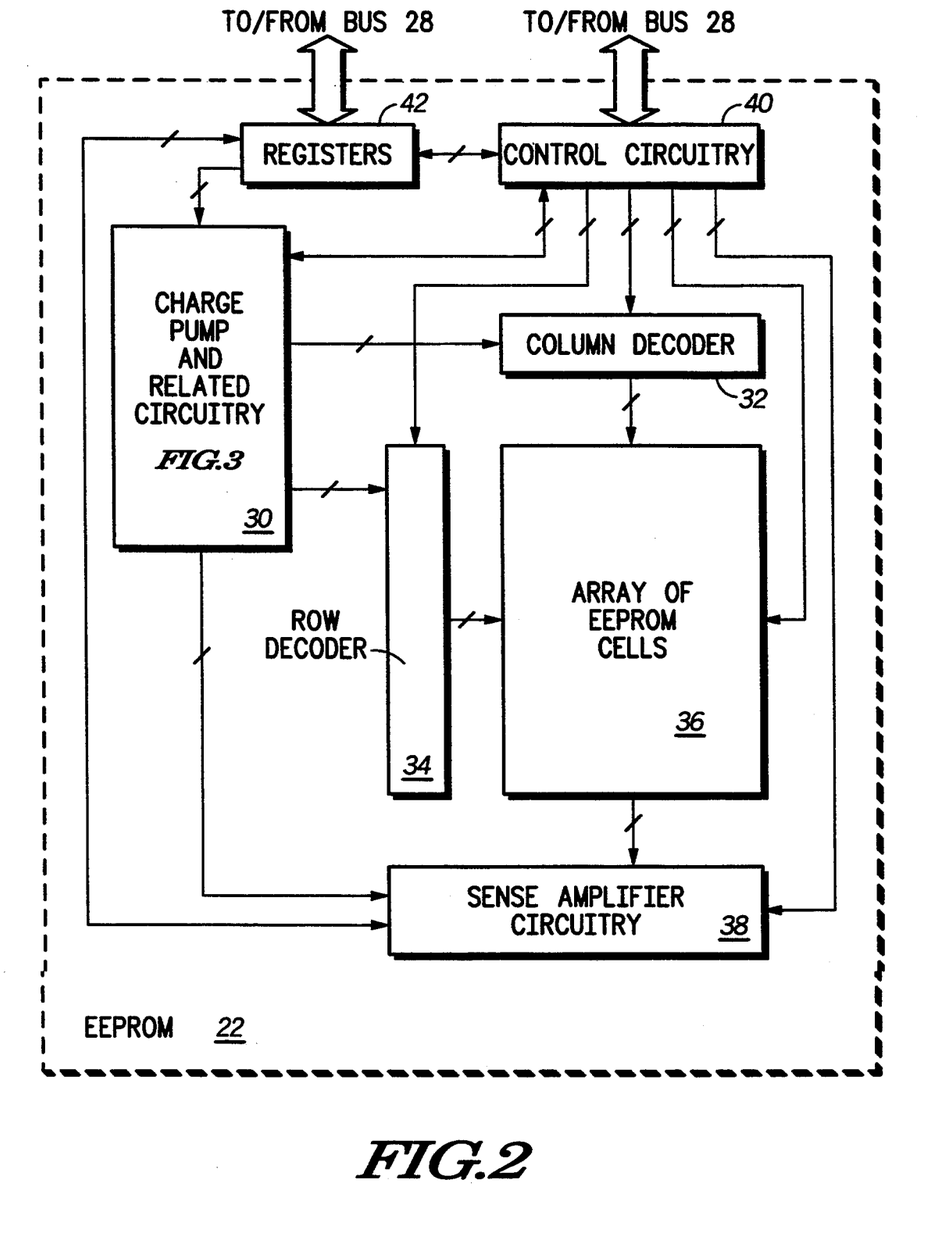
FIG. 2 illustrates, in block diagram form, an EEPROM 22 of FIG. 1 in accordance with one embodiment of the present invention.

FIG. 2 illustrates one embodiment of EEPROM 22 that includes an array of EEPROM cells 36, row decoder 34, column decoder 32, sense amplifier circuitry 38, control circuitry 40, registers 42, and charge pump and related circuitry 30. EEPROM 22 operates in the same manner as standard prior art EEPROMs. Other than charge pump and related circuitry 30, the circuitry in EEPROM 22 is standard and is known to one of average skill in the art.

In one embodiment of EEPROM 22, control circuitry 40 and registers 42 are bi-directionally coupled to bus 28. Control circuitry 40 provides signals to and receives signals from registers 42. Control circuitry 40 provides signals to and receives signals from charge pump and related circuitry 30. Control circuitry 40 provides signals to row decoder 34, column decode 32, sense amplifier circuitry 38, and the array of EEPROM cells 36. Registers 42 provide signals to and receive signals from sense amplifier circuitry 38. Registers 42 also provide signals to and receive signals from charge pump and related circuitry 30. Charge pump and related circuitry 30 provides signals to row decoder 34, column decoder 32, and sense amplifier circuitry 38. Row decoder 34 and column decoder 32 provide signals to the array of EEPROM cells 36. The array of EEPROM cells 36 provides signals to sense amplifier circuitry 38.

Figure 3:
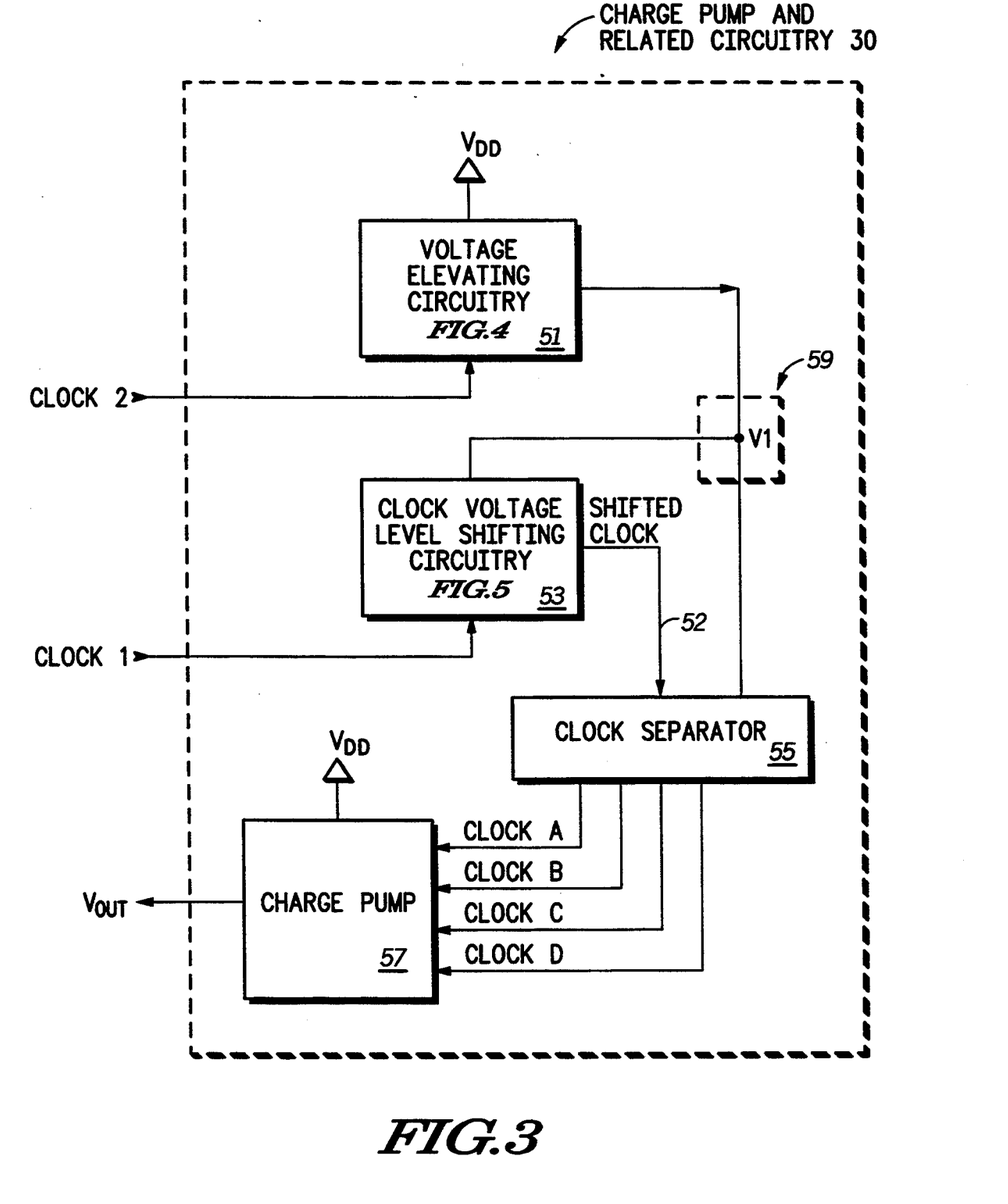
FIG. 3 illustrates, in block diagram form, charge pump and related circuitry 30 in accordance with one embodiment of the present invention.

FIG. 3 illustrates one embodiment of charge pump and related circuitry 30. Charge pump and related circuitry 30 includes voltage elevating circuitry 51, clock voltage level shifting circuitry 53, clock separator 55, and charge pump 57. In one embodiment, charge pump and related circuitry 30 receives two clock signals as inputs, namely CLOCK1 and CLOCK2. Charge pump and related circuitry 30 also receives two power supply voltages, namely VDD and VSS. In one embodiment of the present invention, VDD is specified to be in the range of 1.8 volts to 3.2 volts, and VSS is approximately 0 volts (i.e. approximately ground).

In one embodiment of the present invention, voltage elevating circuitry 51 receives a CLOCK2 signal which switches between VSS and VDD, and also receives a power supply voltage VDD. Voltage elevating circuitry 51 provides an elevated, intermediate output voltage, namely V1, at node 59. Note that VDD is either an internally or externally supplied operating voltage that has a lower voltage potential than either V1 or VOUT. Also, note that CLOCK2 can be either an internally or externally generated signal.

Clock voltage level shifting circuitry 53 receives a CLOCK1 signal which switches between VSS and VDD, and also receives the voltage V1. Clock voltage level shifting circuitry 53 produces a SHIFTED CLOCK signal 52 which switches between VSS and V1. Note that in some embodiments of the present invention, the CLOCK1 signal and the CLOCK2 signal may be the same signal. In alternate embodiments of the present invention, the CLOCK1 signal and the CLOCK2 signal may be different signals.

Clock separator circuit 55 is a standard, prior art circuit known to one of average skill in the art. However, in the prior art, the clock separator circuit received VDD and CLOCK 1 as inputs, rather than V1 and SHIFTED CLOCK as illustrated in FIG. 3. The present invention thus provides a clock separator circuit 55 with input signals V1 and SHIFTED CLOCK having elevated maximum voltages.

Clock separator circuit 55 produces one or more clock signals which are provided to charge pump 57. In one embodiment of the present invention, clock separator circuit 55 does not significantly affect the maximum and minimum voltage level of the SHIFTED CLOCK signal. Thus, in one embodiment of the present invention, CLOCKA signal, CLOCKB signal, CLOCKC signal, and CLOCKD signal have approximately the same minimum and maximum voltages as the SHIFTED CLOCK signal, namely a minimum voltage level of approximately VSS and a maximum voltage level of approximately V1 (see FIG. 6).

In one embodiment of the present invention, clock separator circuit 55 is a standard non-overlapping, 2-phase clock separator. In an alternate embodiment of the present invention, clock separator 55 does not alter the SHIFTED CLOCK signal, but merely passes the SHIFTED CLOCK signal through to charge pump 57.

Charge pump circuit 57 is a standard, prior art charge pump known to one of average skill in the art. In one embodiment of the present invention, charge pump 57 uses a series of "bucket-brigade" stages to build up the output voltage VOUT. In the prior art, the charge pump circuit received one or more clocks which did not have elevated maximum voltages. In the present invention, however, charge pump 57 receives one or more clocks, namely CLOCKA, CLOCKB, CLOCKC, and CLOCKD, which do have elevated maximum voltages. The present invention thus provides a charge pump circuit 57 with one or more input clock signals having elevated maximum voltages.

Still referring to FIG. 3, each individual stage of charge pump circuit 57 includes a circuit that controls charge transfer (not shown) and a capacitor (not shown) to store the transferred charge. Charge pump 57 receives power supply voltage VDD and one or more clock signals provided by clock separator 55. Charge pump 57 provides an output voltage VOUT that has a higher voltage potential than either VDD or V1. The output voltage VOUT may be used for a variety of applications which require an elevated voltage above that of the power supply voltage VDD. Note that for the illustrated embodiment of the present invention, a power supply voltage VDD as low as 1.8 volts may be used to provide an output voltage VOUT as high as 18 volts.

Figure 4:
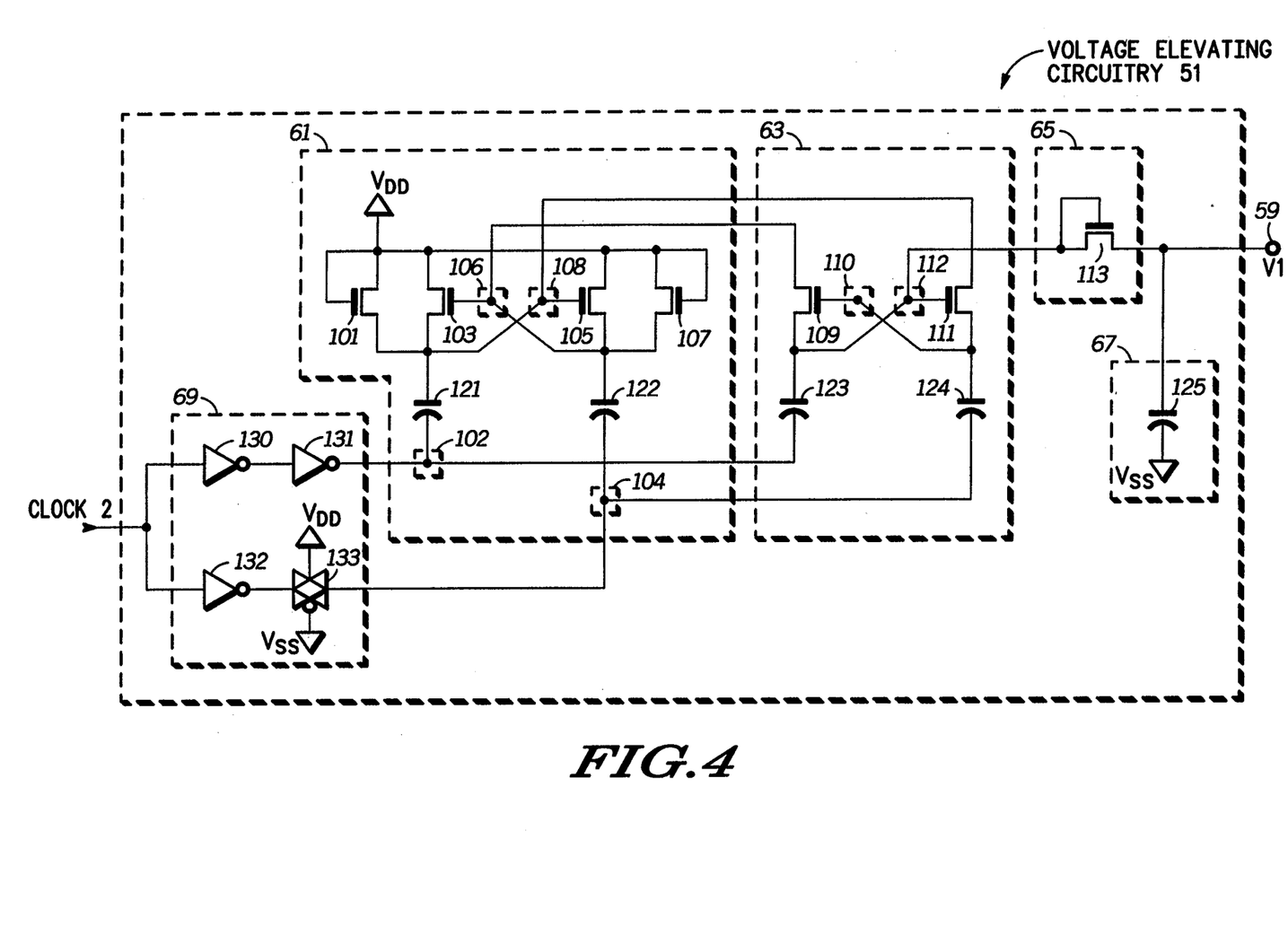
FIG. 4 illustrates, in schematic diagram form, voltage elevating circuitry 51 of FIG. 3 in accordance with one embodiment of the present invention.

FIG. 4 illustrates one embodiment of the voltage elevating circuitry 51 of FIG. 3. In one embodiment, voltage elevating circuitry 51 includes a circuit 61, a circuit 63, a circuit 65, a circuit 67, and a circuit 69 as illustrated in FIG. 4. In the illustrated embodiment, inverting logic gate 130 and inverting logic gate 132 each have an input coupled to receive a CLOCK2 signal. The output of inverting logic gate 130 is coupled to an input of inverting logic gate 131. The output of inverting logic gate 132 is coupled to a data input of transmission logic gate 133. A first control input of transmission logic gate 133 is coupled to a positive power supply voltage terminal for receiving a positive power supply voltage labeled VDD. In one embodiment of the present invention, transmission logic gate 133 is in a conducting state when the first power supply voltage VDD is being applied.

N-channel MOSFET transistors 101, 103, 105, and 107 each have a first current electrode coupled to the positive power supply voltage terminal for receiving the positive power supply voltage VDD. Transistor 101 has a control electrode coupled to the positive power supply voltage; likewise transistor 107 has a control electrode coupled to the positive power supply voltage.

A capacitive element 121 has a first electrode coupled to a second current electrode of transistor 101, to a second current electrode of transistor 103, to a control electrode of transistor 105, and to a node 108. The capacitive element 121 has a second electrode coupled to node 102. Node 102 is also coupled to the output of inverting logic gate 131. A capacitive element 122 has a first electrode coupled to a second current electrode of transistor 105, to a second current electrode of transistor 107, to a control electrode of transistor 103, and to a node 106. The capacitive element 122 has a second electrode coupled to node 104. Node 104 is also coupled to the data output of transmission logic gate 133.

N-channel MOSFET transistor 109 has a first current electrode coupled to node 106. N-channel MOSFET transistor 111 has a first current electrode coupled to node 108. A capacitive element 123 has a first electrode coupled to a second current electrode of transistor 109, to a control electrode of transistor 111, and to a node 112. The capacitive element 123 has a second electrode coupled to node 102. A capacitive element 124 has a first electrode coupled to a second current electrode of transistor 111, to a control electrode of transistor 109, and to a node 110. The capacitive element 124 has a second electrode coupled to node 104.

N-channel MOSFET transistor 113 has a first current electrode and a control electrode coupled to node 112. A capacitive element 125 has a first electrode coupled to a second current electrode of transistor 113 and to a node 59. The capacitive element 125 has a second electrode coupled to a second power supply voltage terminal for receiving a power supply voltage labeled VSS. In one embodiment of the present invention, VSS is an approximately ground potential. Voltage elevating circuitry 51 provides a voltage V1 at node 59. The voltage V1 is at a higher potential than the power supply voltage VDD.

In one embodiment of the present invention, voltage elevating circuitry 51 functions as a secondary charge pump circuit that is more suitable for generating an elevated, intermediate voltage V1, rather than for providing a higher potential final output voltage such as VOUT. One potential problem with using voltage elevating circuitry 51 as a primary charge pump, such as charge pump 57 in FIG. 3, is that the capacitors 121–125 required to handle a large load coupled to node 59 may require a significant amount of semiconductor area on an integrated circuit. For example, under some loading conditions, each capacitor 121–125 may be 10 picofarads or more. Although the voltage elevating circuitry 51 may be used to provide the final output voltage VOUT in an alternate embodiment of the present invention, this alternate embodiment may require more semiconductor area than a typical prior art charge pump.

The operation of the circuitry illustrated in FIG. 4 will now be discussed. Note the term "VGSxxx" refers to the gate-to-source voltage of transistor xxx. The input clock signal, namely CLOCK2, is separated by circuit 69 into non-overlapping, non-inverting and inverting signals provided to circuits 61 and 63 at nodes 102 and 104. Circuits 61 and 63 receive the non-inverting clock signal at node 102, and the inverting clock signal at node 104. Circuit 61 acts as a first stage of voltage elevating circuitry 51. Initially, when CLOCK2 is at its minimum voltage level, namely VSS, node 102 is also at voltage VSS. As a result, capacitive element 121 is charged to (VDD-VGS101) since transistor 101 behaves as a diode.

After the CLOCK2 signal transitions to its maximum voltage level VDD, the voltage at node 108 is [VDD+(VDD-VGS101)]. As the voltage at node 108 is elevated, positive feedback through transistor 105 pulls node 106 up to VDD. At this point, capacitor 122 is charged up to VDD, rather than to (VDD-VGS107). On the next cycle, when the CLOCK2 signal again transitions to VSS, the voltage at node 106 is elevated to (2*VDD) and positive feedback through transistor 103 pulls node 108 up to VDD, charging capacitive element 121 to VDD. As the cycling of the CLOCK2 signal continues, circuit 61 uses positive feedback to provide higher charging efficiency, thus eliminating the voltage drop associated with transistors such as transistor 101 and transistor 107.

In the embodiment of the present invention illustrated in FIG. 4, the second stage (i.e. circuit 63) uses the voltage of (2*VDD) at node 106 to accomplish the task of elevating the voltage at node 112 to the voltage of (3*VDD). When node 106 reaches the voltage of (2*VDD) as the CLOCK2 signal transitions to VSS, node 124 goes high to VDD and node 110 is at VDD. This causes transistor 109 to conduct and node 112 to elevate to the voltage (2*VDD). When the CLOCK2 signal goes high to VDD, node 112 is elevated to the voltage (3*VDD), which is VDD above the output of the first stage circuit 61.

Note that in one embodiment of the present invention, circuit 61 is the same as circuit 63 with the addition of transistors 101 and 107. Transistor 101 is used to precharge capacitive element 121 to a voltage of (VDD-VGS101), and transistor 107 is used to precharge capacitive element 122 to a voltage of (VDD-VGS107).

Although the embodiment of the present invention illustrated in FIG. 4 shows two charge pump stages, namely circuit 61 as the first charge pump stage and circuit 63 as the second charge pump stage, alternate embodiments of the present invention may use one or more charge pump stages. For example, if a third charge pump stage is desired, a duplicate of circuit 63 may be coupled to existing circuit 63 in the same manner that existing circuit 63 is coupled to circuit 61. Each charge pump stage, i.e. each circuit 63, can be used to elevate the voltage at node 112 by an additional VDD. Theoretically, if a total of "N" stages (i.e. circuits 63) were coupled to the output of the first stage (i.e. circuit 61), the voltage at node 112 would be elevated to approximately [(2*VDD)+(N*VDD)]. Note that the voltage V1 may actually be less than [(2*VDD)+(N*VDD)], depending upon the load coupled to node 59.

Circuit 65 and circuit 67 convert the output voltage of the final stage, namely V1, into a DC voltage (i.e. an output voltage that maintains an approximately constant voltage level). Circuit 65 behaves as a diode by preventing charge from being conducted from node 59 back to node 112. Circuit 67 stores charge and helps to maintain the voltage V1 at an approximately constant voltage. Note that there is a voltage drop across the transistor 113.

Thus the net output voltage V1 of voltage elevating circuitry 51 is the output voltage from the final stage, e.g. (3*VDD) at node 112, minus the voltage drop across the circuit 65. Note that in an alternate embodiment of the present invention, one or more diodes or transistors (not shown) can be used for clamping V1 if it is necessary to prevent the intermediate output voltage V1 from exceeding a predetermined voltage level.

Figure 5:
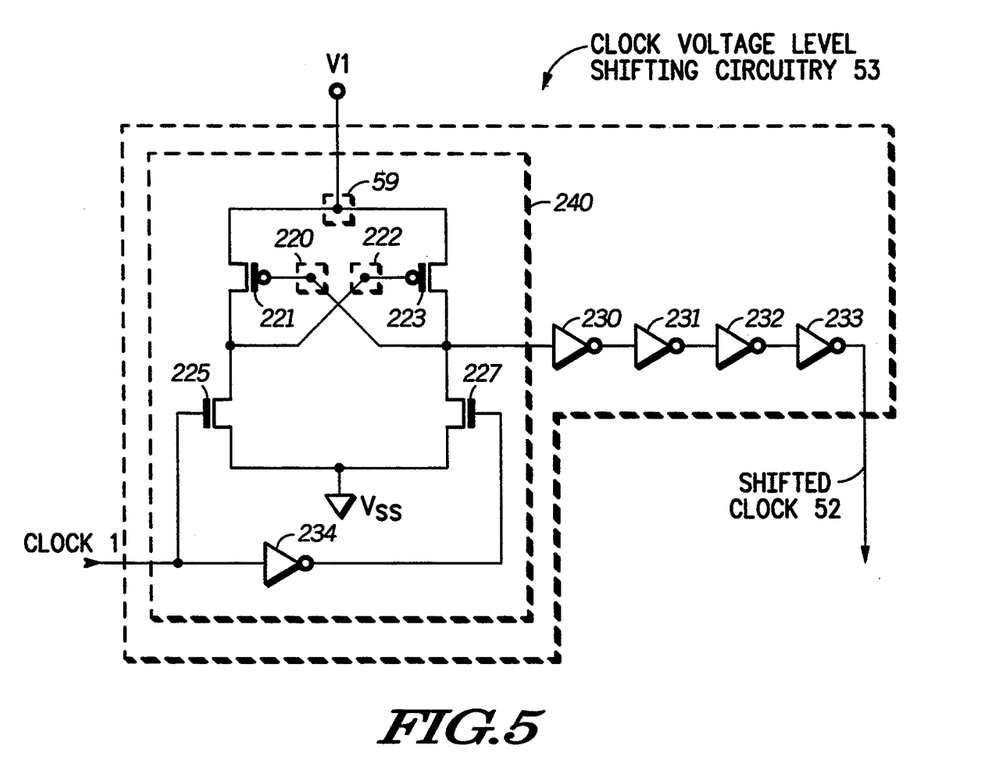
FIG. 5 illustrates, in schematic diagram form, clock voltage level shifting circuitry 53 of FIG. 3 in accordance with one embodiment of the present invention.

FIG. 5 illustrates one embodiment of the clock voltage level shifter circuit 53 of FIG. 3. In one embodiment, clock voltage level shifter circuit 53 includes a circuit 240 and a buffer circuit 230-233 as illustrated in FIG. 4. In the illustrated embodiment, inverting logic gate 234 has an input coupled to receive a CLOCK1 signal.

P-channel MOSFET transistors 221 and 223 each have a first current electrode coupled to node 59 for receiving the voltage V1. N-channel MOSFET transistor 225 has a first current electrode coupled to a second current electrode of transistor 221 and coupled to a control electrode of transistor 223. Transistor 225 has a second current electrode which is coupled to the second power supply voltage terminal for receiving a power supply voltage labeled VSS. Transistor 225 has a control electrode for receiving the CLOCK1 signal.

N-channel MOSFET transistor 227 has a first current electrode coupled to a second current electrode of transistor 223 and coupled to a control electrode of transistor 221. Transistor 227 has a second current electrode which is coupled to the second power supply voltage terminal for receiving a power supply voltage VSS. Transistor 227 has a control electrode coupled to the output of inverting logic gate 234 for receiving the inverted CLOCK1 signal.

Buffer circuit 230-233 is optional. Buffer circuit 230-233 may be used to increase the drive capability of the SHIFTED CLOCK signal provided at conductor 52. The greater the drive capability of the SHIFTED CLOCK signal, the larger the load which can be driven by the SHIFTED CLOCK signal. Although the embodiment of the present invention illustrated in FIG. 5 uses a plurality of series coupled inverting logic gates, namely inverting logic gates 230-233, alternate embodiments of the present invention may use more inverting logic gates, fewer inverting logic gates, or different inverting logic gates.

The operation of the circuitry illustrated in FIG. 5 will now be discussed. Clock voltage level shifting circuitry 53 receives the CLOCK1 signal and provides a SHIFTED CLOCK signal which is the same as the CLOCK1 signal, except that the maximum voltage level of the CLOCK1 signal is VDD, and the maximum voltage level of the SHIFTED CLOCK signal is V1. Thus clock voltage level shifting circuitry 53 effectively elevates the maximum voltage of CLOCK1 from VDD to the intermediate voltage level V1.

Initially, when CLOCK1 goes high to VDD, transistor 225 is conducting while transistor 227 is non-conducting. At this point, node 222 is at the voltage VSS, which causes transistor 223 to conduct. Node 220 is held to the voltage level at node 59, namely V1, which is coupled to the output node 59 of the voltage elevating circuitry 51. At this point, transistor 221 is non-conducting.

On the next cycle, as CLOCK1 goes low to the voltage VSS, transistor 227 becomes conducting while transistor 225 becomes non-conducting. At this point, node 220 returns to the voltage VSS, which causes transistor 221 to conduct. Node 222 is held at the intermediate output voltage level V1 and transistor 223 is non-conducting. As a result, the unbuffered output node 220 switches between the voltage VSS and the elevated, intermediate output voltage V1. This cycle continues indefinitely, elevating the maximum voltage level of the CLOCK1 signal to the output voltage level V1 provided by the voltage elevating circuitry 51. Buffers such as buffer 230, buffer 231, buffer 232, and buffer 233 may be needed to strengthen the drive capability of the unbuffered clock signal at node 220.

Figure 6:
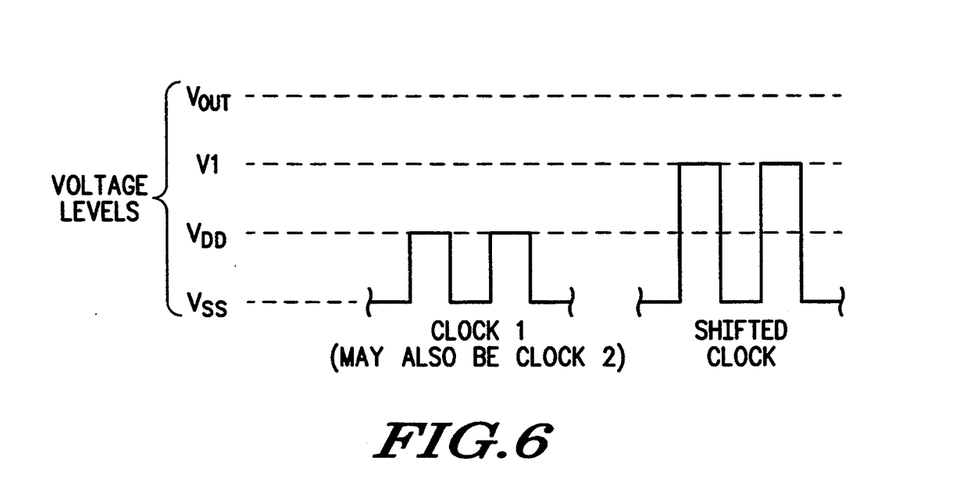
FIG. 6 illustrates, in graphical form, the relationships between the voltages levels of VSS, VDD, V1, and VOUT, and the maximum and minimum voltage levels of CLOCK1, CLOCK2, and SHIFTED CLOCK signals in accordance with one embodiment of the present invention.

FIG. 6 illustrates the relationships between the voltages levels of VSS, VDD, V1, and VOUT. FIG. 6 also illustrates the maximum and minimum voltage levels of CLOCK1, CLOCK2, and SHIFTED CLOCK.

In summation, the present invention provides charge pump and related circuitry 30 which can be used to provide a high voltage output (18 volts or more) using a low power supply voltage (below 2 volts). The present invention extends the operating voltage range of charge pumps by utilizing voltage elevating circuitry 51 and clock voltage level shifting circuitry 53: (1) to produce stronger clock drives to circuits (e.g. clock separator 55) which control the charge transfer between the stages; and (2) to increase the amount of charge that can be stored on the capacitors in the stages (e.g. in the stages of charge pump 57). Thus, under circumstances where a typical prior art charge pump would fail, the present invention can continue to produce an output voltage of 18 volts or more using a power supply voltage as low as 1.8 volts (and possibly even lower).

While the present invention has been illustrated and described with reference to specific embodiments, further modifications and improvements will occur to those skilled in the art. It is to be understood, therefore, that this invention is not limited to the particular forms illustrated and that the appended claims cover all modifications that do not depart from the spirit and scope of this invention.

I claim:

1. A circuit for generating an output voltage, comprising:
   voltage elevating means (51) for receiving an input voltage having a first predetermined voltage level and for providing an intermediate voltage having a second predetermined voltage level, wherein the second predetermined voltage level is higher potential than the first predetermined voltage level;
   clock voltage level shifting means (53) for receiving a first input clock signal having a maximum voltage level substantially equal to the first predetermined voltage level, for receiving the intermediate voltage, and for providing a shifted clock signal having a maximum voltage level substantially equal to the second predetermined voltage level, said clock voltage level shifting means being coupled to said voltage elevating means;
   clock separating means (55) for receiving the shifted clock signal, for receiving the intermediate voltage, and for providing at least one output clock signal, said clock separating means being coupled to said voltage elevating means and to said clock voltage level shifting means; and
   charge pump circuitry (57) for receiving the at least one output clock signal and for providing the output voltage having a third predetermined voltage level, wherein the third predetermined voltage level is higher potential than the second predetermined voltage level, said charge pump circuitry being coupled to said clock separating means.

2. A circuit as in claim 1, wherein said voltage elevating means comprises:
   first circuit means (61,69) for receiving the input voltage, for receiving a second input clock signal, and for providing a first internal voltage having a fourth predetermined voltage level, wherein the fourth predetermined voltage level is higher potential than the first predetermined voltage level;
   second circuit means (63) for receiving the first internal voltage, for receiving the second input clock signal, and for providing a second internal voltage having a fifth predetermined voltage level, wherein the fifth predetermined voltage level is higher potential than the fourth predetermined voltage level, said second circuit means being coupled to said first circuit means; and
   third circuit means (65,67) for maintaining an output node at the second predetermined voltage level, said third circuit means being coupled to said second circuit means.

3. A circuit as in claim 2, wherein said first circuit means comprises:

a clock circuit (69) for receiving the second input clock signal and for providing a buffered clock signal and for providing a negated buffered clock signal.

4. A circuit as in claim 3, wherein said first circuit means further comprises:
   a first capacitive element (121), having a first electrode, and having a second electrode coupled to said clock circuit for receiving the buffered clock signal;
   a first transistor (101) having a first current electrode coupled to a first voltage terminal for receiving the input voltage, having a second current electrode coupled to the first electrode of said first capacitive element, and having a gate electrode coupled to the first voltage terminal;
   a second transistor (103) having a first current electrode coupled to the first voltage terminal for receiving the input voltage, having a second current electrode coupled to the first electrode of said first capacitive element, and having a gate electrode;
   a second capacitive element (122), having a first electrode coupled to the gate electrode of said second transistor, and having a second electrode coupled to said clock circuit for receiving the negated buffered clock signal;
   a third transistor (105) having a first current electrode coupled to the first voltage terminal for receiving the input voltage, having a second current electrode coupled to the first electrode of said second capacitive element, and having a gate electrode coupled to the first electrode of said first capacitive element; and
   a fourth transistor (107) having a first current electrode coupled to the first voltage terminal for receiving the input voltage, having a second current electrode coupled to the first electrode of said second capacitive element, and having a gate electrode coupled to the first voltage terminal.

5. A circuit as in claim 3, wherein said second circuit means comprises:
   a first capacitive element (123), having a first electrode, and having a second electrode coupled to said clock circuit for receiving the buffered clock signal;
   a first transistor (109) having a first current electrode coupled to said first circuit means, having a second current electrode coupled to the first electrode of said first capacitive element, and having a gate electrode;
   a second capacitive element (124) having a first electrode coupled to the gate electrode of said first transistor, and having a second electrode coupled to said clock circuit for receiving the negated buffered clock signal; and
   a second transistor (111) having a first current electrode coupled to said first circuit means, having a second current electrode coupled to the first electrode of said second capacitive element, and having a gate electrode coupled to the first electrode of said first capacitive element.

6. A circuit as in claim 2, wherein said third circuit means comprises:
   a first capacitive element (125), having a first electrode, and having a second electrode coupled to a second voltage terminal for receiving a power supply voltage; and a first transistor (113) having a first current electrode coupled to said second circuit means, having a second current electrode coupled to the first electrode of said first capacitive element, and having a gate electrode coupled to the first current electrode of said first transistor.

7. A circuit as in claim 1, wherein the first predetermined voltage level is substantially equal to a first power supply voltage level.

8. A circuit as in claim 7, wherein the first input clock signal has a minimum voltage level substantially equal to a second power supply voltage level, and wherein the shifted clock signal has a minimum voltage level substantially equal to the second power supply voltage level.

9. A circuit as in claim 1, wherein said voltage elevating means comprises:
a clock input for receiving a second input clock signal.

10. A circuit as in claim 9, wherein the first input clock signal and the second input clock signal are a same signal.

11. A circuit as in claim 1, wherein said clock voltage level shifting means comprises:
first circuit means (240) for receiving the first input clock signal, for receiving the intermediate voltage, and for providing an unbuffered shifted clock signal, the unbuffered shifted clock signal having a maximum voltage level substantially equal to the second predetermined voltage level, said first circuit means being coupled to said voltage elevating means.

12. A circuit as in claim 11, wherein said first circuit means comprises:
a first transistor (221) having a first current electrode coupled to said voltage elevating means for receiving the intermediate voltage, having a second current electrode, and having a gate electrode;
a second transistor (223) having a first current electrode coupled to said voltage elevating means for receiving the intermediate voltage, having a second current electrode coupled to the gate electrode of said first transistor, and having a gate electrode coupled to the second current electrode of said first transistor;
a third transistor (225) having a first current electrode coupled to the second current electrode of said first transistor, having a second current electrode coupled to a voltage terminal for receiving a power supply voltage, and having a gate electrode coupled to receive the first input clock signal; and
a fourth transistor (227) having a first current electrode coupled to the second current electrode of said second transistor, having a second current electrode coupled to the voltage terminal for receiving the power supply voltage, and having a gate electrode coupled to receive a negated first input clock signal.

13. A circuit as in claim 11, wherein said clock voltage level shifting means further comprises:
a buffer circuit (230-233) for receiving the unbuffered shifted clock signal and for providing the shifted clock signal, said buffer circuit being coupled to said first circuit means.

14. A circuit as in claim 13, wherein said buffer circuit comprises:

a first inverter (230), having an input coupled to said first circuit means for receiving the unbuffered shifted clock signal, and having an output; and
a second inverter (233), having an input coupled to the output of said first inverter, and having an output coupled to said clock separating means for providing the shifted clock signal.

15. A circuit as in claim 1, wherein the output voltage is used to program a memory.

16. An integrated circuit, comprising:
a memory;
wherein said memory comprises:
voltage elevating means (51) for receiving an input voltage having a first predetermined voltage level and for providing an intermediate voltage having a second predetermined voltage level, wherein the second predetermined voltage level is higher potential than the first predetermined voltage level;
clock voltage level shifting means (53) for receiving a first input clock signal having a maximum voltage level substantially equal to the first predetermined voltage level, for receiving the intermediate voltage, and for providing a shifted clock signal having a maximum voltage level substantially equal to the second predetermined voltage level, said clock voltage level shifting means being coupled to said voltage elevating means;
clock separating means (55) for receiving the shifted clock signal, for receiving the intermediate voltage, and for providing at least one output clock signal, said clock separating means being coupled to said voltage elevating means and to said clock voltage level shifting means; and
charge pump circuitry (57) for receiving the at least one output clock signal and for providing an output voltage having a third predetermined voltage level, wherein the third predetermined voltage level is higher potential than the second predetermined voltage level, said charge pump circuitry being coupled to said clock separating means.

17. An integrated circuit as in claim 16, further comprising:
a central processing unit, coupled to said memory.

18. An integrated circuit as in claim 16, wherein said memory is an electrically erasable programmable read only memory (EEPROM).

19. A circuit for receiving a first voltage and for providing a second voltage wherein the second voltage is higher potential than the first voltage, the circuit comprising:
a first capacitive element (121), having a first electrode, and having a second electrode for receiving a clock signal;
a first transistor (103) having a first current electrode coupled to a first voltage terminal for receiving the first voltage, having a second current electrode coupled to the first electrode of said first capacitive element, and having a gate electrode;
a second capacitive element (122), having a first electrode coupled to the gate electrode of said first transistor, and having a second electrode for receiving a negated clock signal;
a second transistor (105) having a first current electrode coupled to the first voltage terminal for receiving the first voltage, having a second current electrode coupled to the first electrode of said second capacitive element, and having a gate electrode coupled to the first electrode of said first capacitive element;

a third capacitive element (123), having a first electrode, and having a second electrode for receiving the clock signal;

a third transistor (109) having a first current electrode coupled to the gate electrode of said first transistor, having a second current electrode coupled to the first electrode of said third capacitive element, and having a gate electrode;

a fourth capacitive element (124), having a first electrode coupled to the gate electrode of said third transistor, and having a second electrode for receiving the negated clock signal; and a fourth transistor (111) having a first current electrode coupled to the gate electrode of said second transistor, having a second current electrode coupled to the first electrode of said fourth capacitive element, and having a gate electrode coupled to the first electrode of said third capacitive element, the gate electrode of said fourth transistor being coupled to a node which provides the second voltage.

20. A circuit as in claim 19, wherein said first transistor is a first n-channel field effect transistor, said second transistor is a second n-channel field effect transistor, said third transistor is a third n-channel field effect transistor, and said fourth transistor is a fourth n-channel field effect transistor.

* * * * *